(12) United States Patent
Yamaguchi

(10) Patent No.: US 7,931,478 B2
(45) Date of Patent: Apr. 26, 2011

(54) ELECTRICAL JUNCTION BOX

(75) Inventor: Jun Yamaguchi, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 115 days.

(21) Appl. No.: 12/289,844

(22) Filed: Nov. 5, 2008

(65) Prior Publication Data
US 2009/0130882 A1 May 21, 2009

(30) Foreign Application Priority Data

Nov. 15, 2007 (JP) ................................ 2007-296649

(51) Int. Cl.
*H01R 12/00* (2006.01)
(52) U.S. Cl. .................... 439/76.1; 439/519; 361/752
(58) Field of Classification Search ................. 439/76.1, 439/519, 271; 361/752, 736; 174/50
See application file for complete search history.

(56) References Cited

U.S. PATENT DOCUMENTS

| | | | | |
|---|---|---|---|---|
| 5,650,591 A | * | 7/1997 | Matsushita et al. | 174/17 VA |
| 5,876,243 A | * | 3/1999 | Sangawa | 439/519 |
| 6,774,309 B2 | * | 8/2004 | Kasai | 174/66 |
| 7,408,765 B2 | | 8/2008 | Kanou | |
| 2004/0160731 A1 | * | 8/2004 | Yamaguchi | 361/600 |
| 2006/0171127 A1 | * | 8/2006 | Kadoya et al. | 361/752 |
| 2008/0223597 A1 | * | 9/2008 | Kanou | 174/50 |

* cited by examiner

Primary Examiner — Hien Vu
(74) Attorney, Agent, or Firm — Oliff & Berridge PLC

(57) ABSTRACT

An electrical junction box comprising: a casing containing a circuit assembly therein; a connector housing disposed on a bottom of the casing and adapted to be coupled to a mating connector; a plurality of terminal metals connected to the circuit assembly and passing through a wall of the connector housing to be drawn into the connector housing; and a waterproof cover formed individually from the casing and disposed in the casing. The waterproof cover includes a first waterproof wall for covering a space above adjacent terminal metals, a second waterproof front wall and second waterproof side walls for partitioning a space between the adjacent terminal metals and a side wall of the casing.

19 Claims, 16 Drawing Sheets

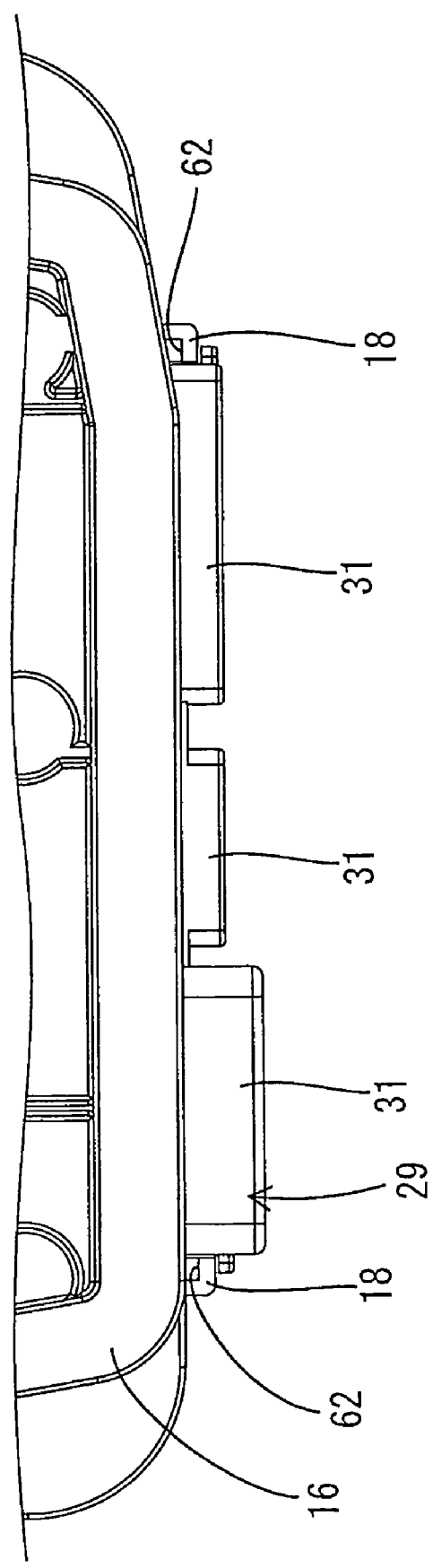

ELECTRICAL JUNCTION BOX

CROSS-REFERENCE TO RELATED APPLICATION

This application claims priority to JP2007-296649 filed in Japan on Nov. 15, 2007, the disclosure of which is hereby incorporated by reference in its entirety.

BACKGROUND

This invention relates to an electrical junction box.

An electrical junction box to be mounted in a motor vehicle has been has been known in the art as disclosed, for example, in U.S. Pat. No. 7,408,765. This electrical junction box comprises a casing containing a circuit assembly, a connector housing mounted on a lower surface side of the casing and including a hood section adapted to be coupled to an external connector, a plurality of terminal metals disposed in the hood section and passing through a ceiling wall of the connector housing to be connected to the circuit assembly in the casing, and a waterproof wall provided in the casing and covering above the ceiling wall.

According to the above construction, even if water enters the casing upon rainfall or vehicle-washing, it is possible for the waterproof wall to restrain the water from falling onto the ceiling wall of the connector housing. Thus, it is possible to prevent the water from adhering to the plural terminal metals passing through the ceiling wall so that the water bridges the terminal metals. Consequently, it is possible to prevent the terminal metals from short-circuiting.

However, in the above construction, a waterproof wall is not provided between a side wall of the casing and the terminal metals. Consequently, there may be a fear that the water adhering to an inner surface of the side wall of the casing is dispersed on account of vibrations of a motor vehicle and is adhered to the terminal metals.

SUMMARY

In view of the above problems, an object of the present invention is to provide an electrical junction box that improves a waterproof function.

An electrical junction box in accordance with the present invention comprises: a casing containing a circuit assembly; a connector housing disposed on a bottom of the casing and adapted to be coupled to a mating connector; a plurality of terminal metals connected to the circuit assembly and passing through a wall of the connector housing to be drawn into the connector housing; and a waterproof cover formed individually from the casing and disposed in the casing. The waterproof cover includes a first waterproof wall for covering a space above adjacent terminal metals, and a second waterproof wall for partitioning a space between the adjacent terminal metals and a side wall of the casing.

According to the present invention, since the waterproof cover including the first waterproof wall for covering a space above the adjacent terminal metals is disposed in the casing, it is possible to restrain from an upper side the water entering the casing from adhering to the terminal metals.

Also, the waterproof cover is disposed in the casing and includes the second waterproof wall for partitioning the space between the side wall of the casing and the adjacent terminal walls. This second waterproof wall can prevent the water dispersed from the side wall from adhering to the terminal metals to short-circuit the adjacent terminal metals. Thus, according to the present invention, it is possible to improve a waterproof function of the electrical junction box.

It is preferable that embodiments of the electrical junction box in accordance with the present invention have the following constructions.

The waterproof cover may be attached to the connector housing.

According to the above construction, it is possible to surely prevent the water from adhering to the terminal metals drawn into the connector housing.

The first waterproof wall may be provided on an upper surface with a downward slope.

According to the above construction, the water adhering to the upper surface of the first waterproof wall is guided by the slope to flow downward. Thus, it is possible to improve a drainage function of the casing.

The connector housing may be provided on an upper surface with a drainage groove for guiding water falling onto the connector housing toward a side of the connector housing.

According to the above construction, the water adhering to the upper surface of the connector housing is guided to the drainage groove and is drained to the side of the connector housing. Thus, it is possible to further improve the drainage function of the casing.

The casing may be provided with a drainage port in the bottom.

According to the above construction, the water flowing down to the bottom of the casing is drained through the drainage port. Thus, it is possible to further improve the drainage function of the casing.

A surface of the circuit assembly may be with a seal member. An end edge of the first waterproof wall at a side of the circuit assembly may be embedded in the seal member.

According to the above construction, it is possible to prevent the water from entering the space between the first waterproof wall and the seal member.

A surface of the circuit assembly may be covered with a seal member. An end edge of the second waterproof wall at a side of the circuit assembly may be embedded in the seal member.

According to the above construction, it is possible to prevent the water from entering the space between the second waterproof wall and the seal member.

A surface of the circuit assembly may be covered with a seal member. End edges of the first and second waterproof walls at a side of the circuit assembly may be embedded in the seal member.

According to the above construction, it is possible to prevent the water from entering the space between the first and second waterproof walls and the seal member.

According to the present invention, it is possible to improve the waterproof function of the electrical junction box.

BRIEF DESCRIPTION OF THE DRAWINGS

FIG. 16 is an enlarged rear elevation view of a main part of the electrical junction box.

DETAILED DESCRIPTION OF EMBODIMENTS

Referring now to FIGS. 1 through 16, an embodiment in which the present invention is applied to an electrical junction box 10 will be described below. The electrical junction box 10 is connected between a power source (not shown) such as a battery and on-vehicle electrical components (not shown) such as head lamps and wipers to switch on and off the on-vehicle electrical components.

In the description hereinafter, an upper side in FIG. 2 defines "an upper part or direction," a lower side in FIG. 2 defines "a lower part or direction." A fore side on the paper in FIG. 2 defines "a front side" and a back side on the paper in FIG. 2 defines "a rear side." A left side in FIG. 2 defines "a left part or direction" and a right side in FIG. 2 defines "a right part or direction."

(Circuit Assembly 12)

Figure 1:
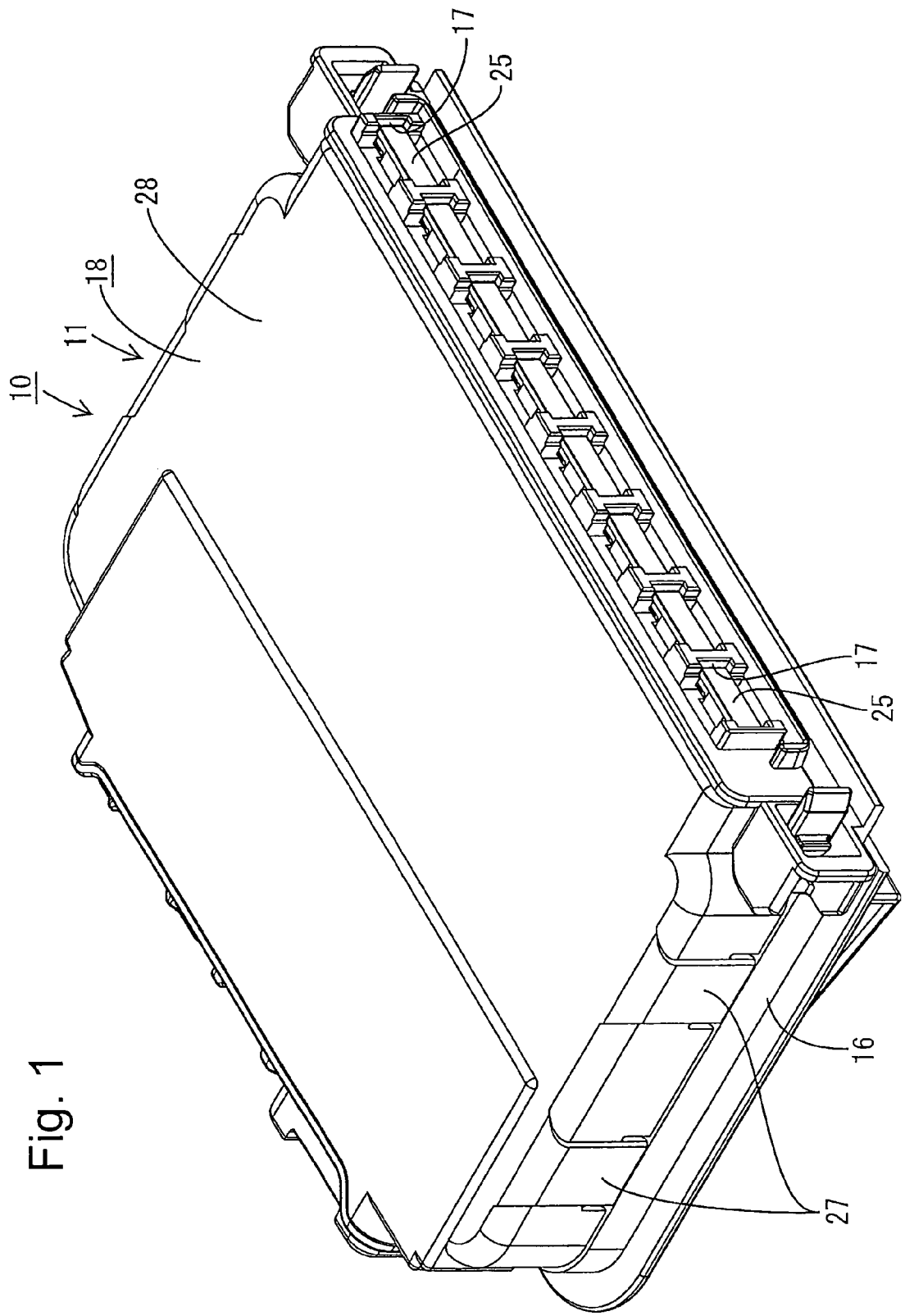
FIG. 1 is a whole perspective view of an embodiment of an electrical junction box in accordance with the present invention.
Figure 3:
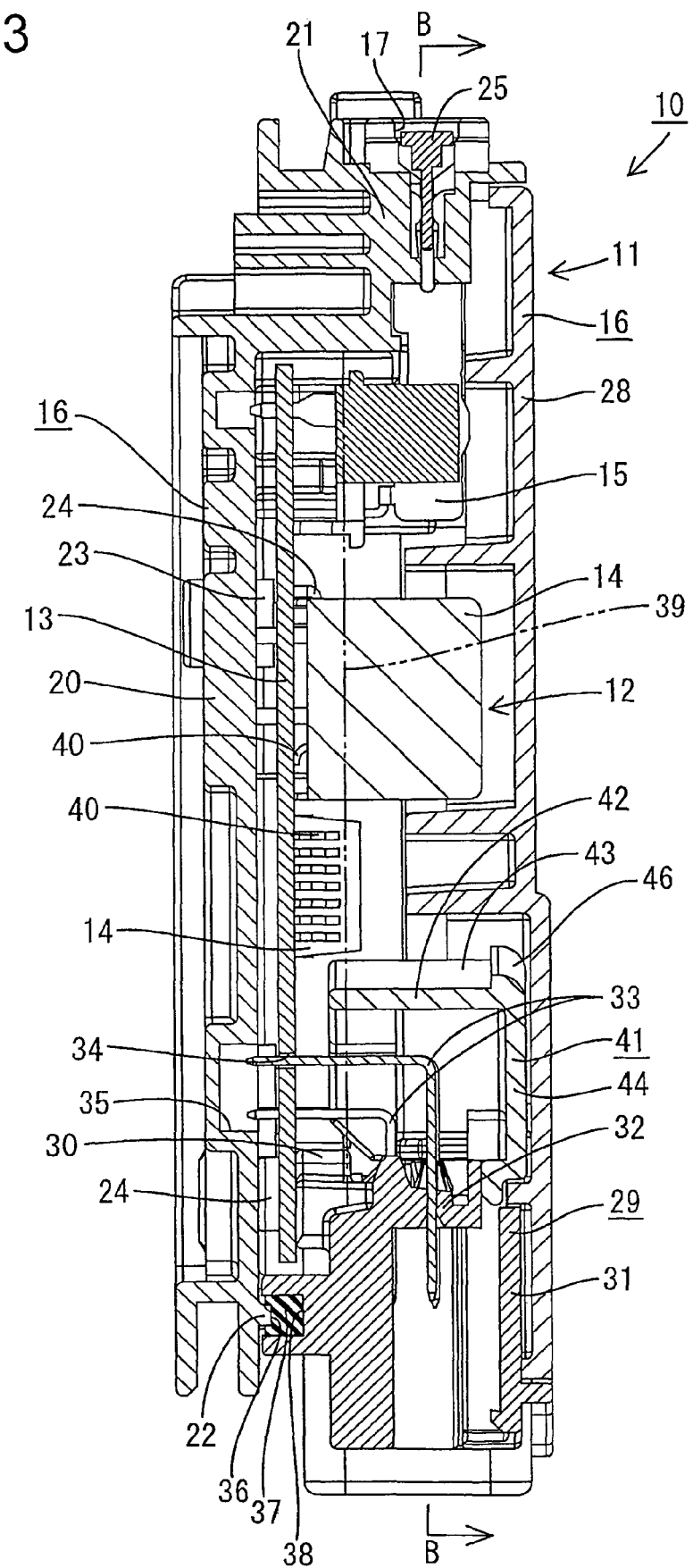
FIG. 3 is a cross section view of the electrical junction box taken along lines A-A in FIG. 2.

As shown in FIG. 1, the electrical junction box 10 contains a circuit assembly 12 (FIG. 3) in a flat casing 11. As shown in FIG. 3, the circuit assembly 12 includes a circuit board 13 on which electrically conductive paths (not shown) are formed by means of a printed wiring technique, and electronic parts 14 are electrically connected to the electrically conductive paths by soldering. For example, a thick film board may be used as the circuit board 13. The thick board is formed by laminating a plurality of insulation boards on which the electrically conductive paths are formed.

The electrical junction box 10 is mounted in a motor vehicle (not shown) so that the circuit board 13 stands up in a vertical direction, as shown in FIG. 3.

A plurality of fuse terminals 15 are disposed at a relatively upper side of the circuit board 13. The fuse terminals 15 are juxtaposed on the circuit board 13 laterally (in a direction perpendicular to the paper surface in FIG. 3). The fuse terminals 15 are formed by pressing a metal sheet. An end of each fuse terminal 15 passes through-holes (not shown) in the circuit board 13 and are electrically connected to the electrically conductive paths on the circuit board by soldering.

The other end of each fuse terminal 15 extends upward and is inserted into a fuse-receiving section 17 of a casing body 16 described below.

(Casing 11)

Figure 2:
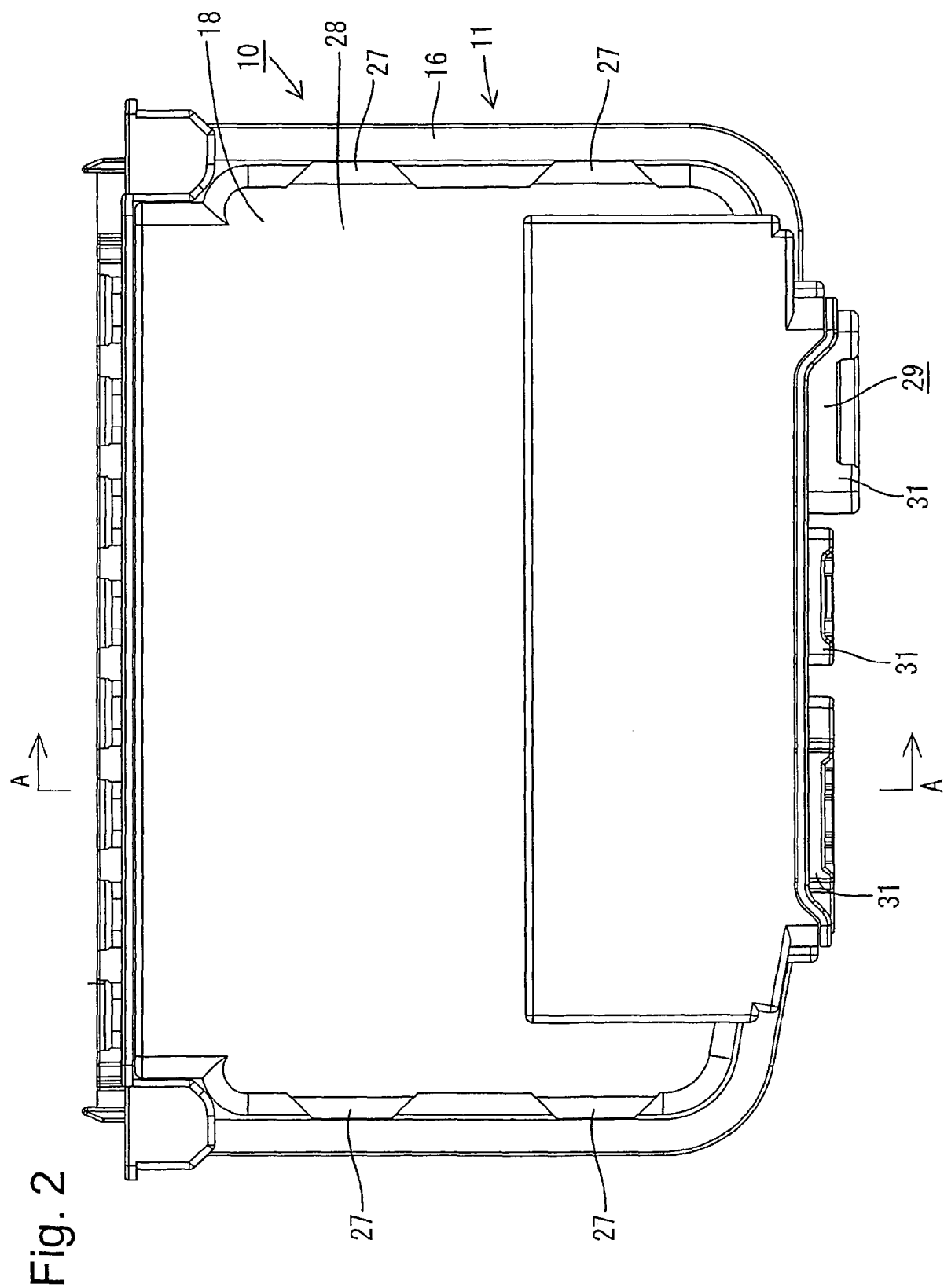
FIG. 2 is a front elevation view of the electrical junction box shown in FIG. 1.
Figure 4:
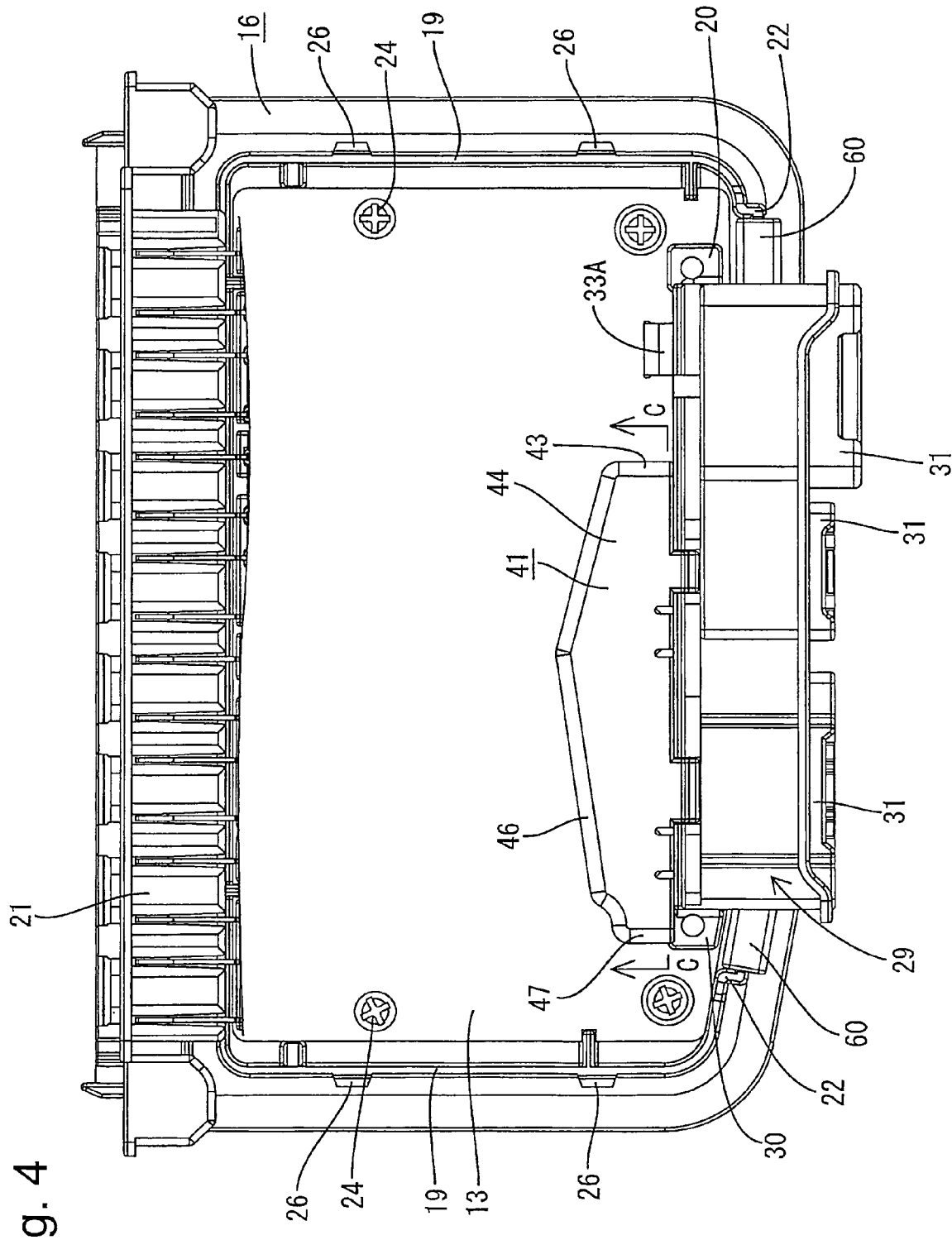
FIG. 4 is a front elevation view of the electrical junction box, illustrating the box from which a cover is removed in FIG. 2.

As shown in FIGS. 1 and 2, the casing 11 includes a casing body 16 made of a synthetic resin material and having an opening, and a cover 18 made of a synthetic resin material for closing the opening in the casing body 16. The casing body 16 is formed into a shallow container with respect to front and rear directions (right and left directions in FIG. 3). As shown in FIGS. 3 and 4, the casing body 16 includes a rear wall 20 at a rear side (left side in FIG. 3), an upper wall 21 at an upper side (upper side in FIG. 4), a lower wall 22 at a lower side (lower side in FIG. 4), and a pair of side walls 19 at right and left sides in FIG. 4. The electronic parts 14 are omitted in FIG. 4.

The casing body 16 is provided on the rear wall 20 with support bosses 23 that project toward a front side (a right side in FIG. 3) and support the circuit board 13 from a rear side (a left side in FIG. 3). The circuit board 13 is mounted on the front surfaces (right surfaces in FIG. 3) of the support bosses 23 and is spaced away from the rear wall 20 to be overlaid on the rear wall 20. The circuit board 13 and casing body 16 are secured to the support bosses 23 by screwing bolts 24 through the circuit board 13 to the support bosses 23.

The casing body 16 is provided on the upper wall 21 with the fuse-receiving section 17 that is open upward (at an upper direction in FIG. 3). A fuse 25 can be mounted in the fuse-receiving section 17. The fuse 25 is inserted into the fuse-receiving section 17 to electrically couple the fuse 25 and fuse terminal 15.

The cover 18 is attached to the casing body 16, when a plurality of lock portions 26 (FIG. 4) provided on an outer side surface of the side wall 19 of the casing body 16 are elastically engaged with a plurality of lock-receiving portions 27 (FIGS. 1 and 2) provided on positions corresponding to the lock portions 26 of the cover 18.

As shown in FIG. 3, the cover 18 includes a front wall 28 (corresponding to a side wall) at a front side (a right side in FIG. 3).

(Connector Housing 29)

An elongated connector housing 29 made of a synthetic resin material is disposed at a relatively lower end with respect to the circuit board 13 in FIG. 3. In the present embodiment, the connector housing 29 serves as a board connector to be connected to the circuit board 13. As shown in FIG. 3, the connector housing 29 is provided with bolt-receiving portions 30 in which bolts 24 passing through the circuit board 13 from its lower side are screwed. When the bolts 24 are screwed in the bolt-receiving portions 30, the connector housing 29 is secured to the circuit board 13.

The connector housing 29 includes a hood section 31 which is open downward (to a lower direction in FIG. 3) and can be coupled to a mating connector (not shown). An inner wall 32 (corresponding to a wall portion) of the hood section 31 at an upper position is provided with through-holes extending vertically. Terminal metals 33 pass the through-holes to be drawn into the hood section 31. A plurality of terminal metals 33 are arranged on the connector housing 29. The terminal metals 33 are juxtaposed on two layers in a vertical direction in FIG. 3 and are also juxtaposed on a line in a horizontal direction in FIG. 6. A terminal metal 33A for a power source to be connected to a battery is disposed at a relatively left side in FIG. 6 in the connector housing 29 so that the terminal metal 33A is spaced away from the other terminal metals 33.

An end of each terminal metal 33 passes the inner wall 32 and projects upward from the connector housing 29. The end is bent toward the circuit board 13 and inserted into each through-hole 34 in the circuit board 13 to be electrically connected to the electrically conductive path on the circuit board 13 by soldering. The rear wall 20 of the casing body 16 is depressed toward the rear side and is provided with a clearance recess 35 that prevents the rear wall 20 from interfering with the terminal metals 33.

The lower wall 22 of the casing body 16 is depressed toward the rear wall 20 and is provided with a receiving recess 36 for containing the connector housing 29. The connector housing 29 is contained in the receiving recess 36. The connector housing 29 is provided in a position opposite the receiving recess 36 with a groove 38 for containing a packing 37. When the packing 37 is contained in the groove 38 and is brought into close contact with a clearance between an inner surface of the groove 38 and the receiving portion 36, a clearance between the casing body 16 and the connector housing 29 is sealed.

As shown by a two-dot chain line in FIG. 3, a seal member 39 is filled in a space enclosed by the connector housing 29 and the rear wall 20, upper wall 21, side wall 19, and lower wall 22 of the casing body 16. The seal member 39 covers a surface of the circuit assembly 12. Specifically, when the surface of the circuit board 13 and lead lines 40 of the electronic parts 14 are covered with the seal member 39, a waterproof function in the electrical junction box 10 can be maintained. The seal member 39 is filled into the clearance recess 35 in the casing body 16 and is filled into a clearance between the circuit board 13 and the rear wall 20 of the casing body 16. The seal member 39 may be made of, for example, a synthetic resin material.

As shown in FIG. 3, the connector housing 29 is disposed on a bottom of the casing 11 so that the opening is directed downward.

(Waterproof Cover 41)

The connector housing 29 is provided on an upper part (an upper side in FIG. 3) with a waterproof cover 41 formed individually from the casing 11 and made of a synthetic resin material. As shown in FIG. 3, the waterproof cover 41 is open at a rear side (a left side in FIG. 3) and a lower side (a lower side in FIG. 3), when the waterproof cover 41 is attached to the connector housing 29. As shown in FIG. 4, the waterproof cover 41 is disposed in the casing 11 so that the waterproof cover 41 covers downward a two-third of lateral width size of the connector housing 29 from a left end.

Figure 6:
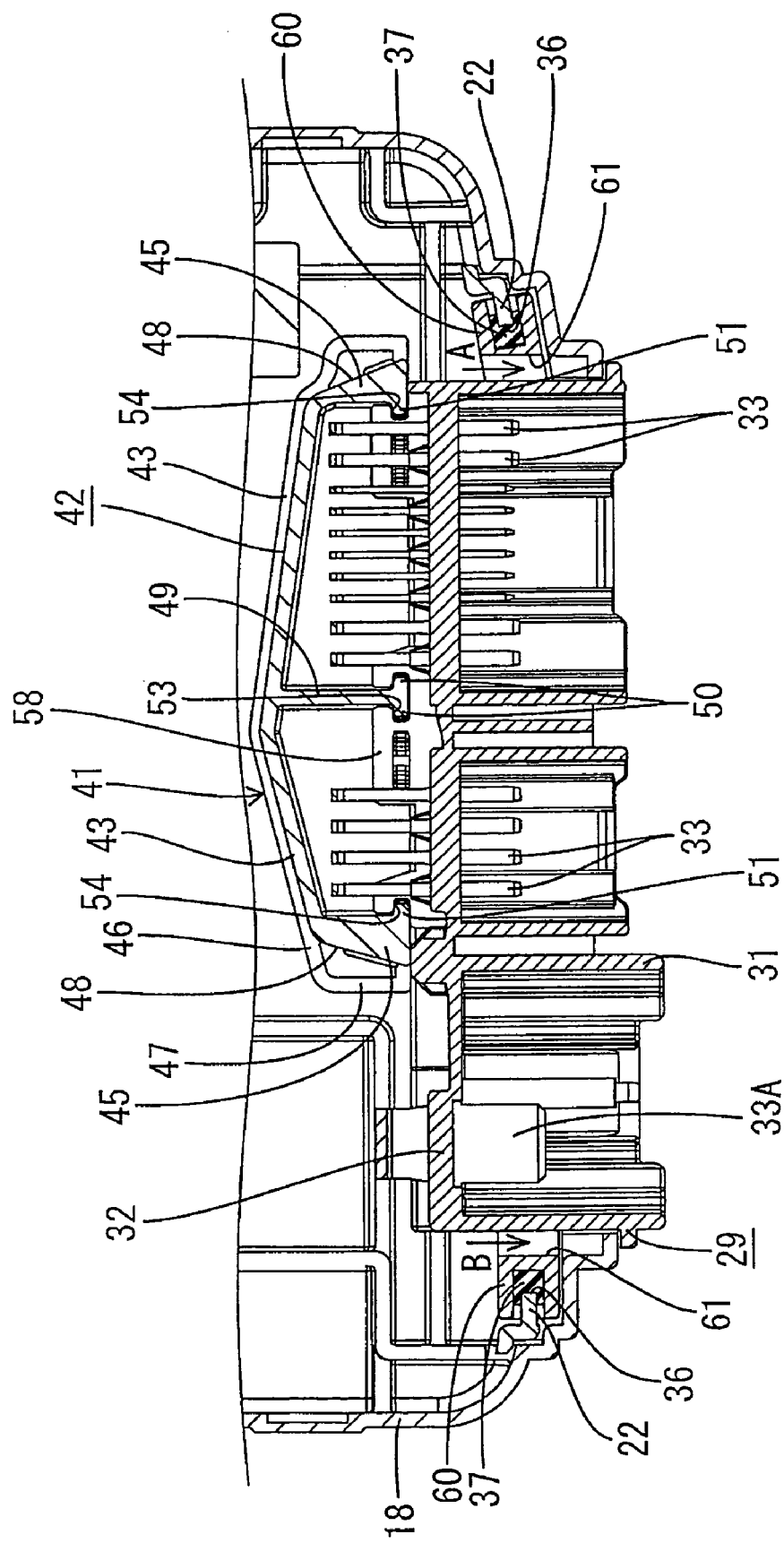
FIG. 6 is an enlarged section view of a main part of the electrical junction box taken along lines B-B in FIG. 3.

As shown in FIG. 3, the waterproof cover 41 includes a first waterproof wall 42 that covers upper parts of the adjacent plural terminal metals 33 disposed on the connector housing 29. As shown in FIG. 6, the first waterproof wall 42 is provided with first downward slopes 43 (corresponding to slopes) that inclines down to laterally opposite ends from a top at a central part in a lateral direction (right and left directions in FIG. 6). The first waterproof wall 42 covers upper parts of the terminal metals 33 except the power source terminal metal 33A.

As shown in FIG. 3, the waterproof cover 41 includes a second waterproof front wall 44 that partitions a space between the front wall 28 of the cover 18 and the adjacent plural terminal metals 33 disposed on the connector housing 29. Also, as shown in FIG. 6, the waterproof cover 41 includes a pair of second waterproof side walls 45 that partitions a space between the side wall 19 (FIG. 4) of the casing body 16 and the terminal metals 33 on the connector housing 29.

Figure 5:
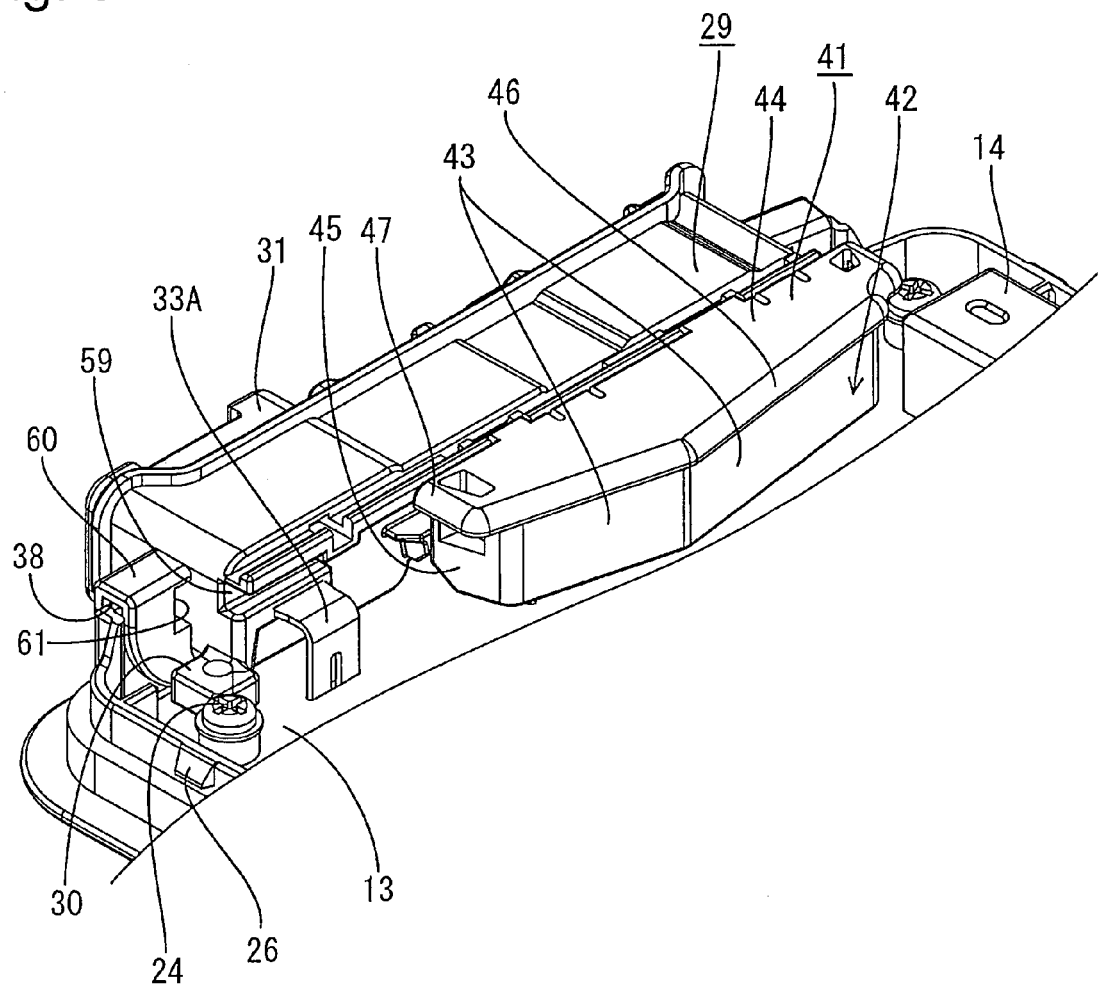
FIG. 5 is an enlarged perspective view of a main part of the electrical junction box, illustrating the box from which the cover is removed in FIG. 1.
Figure 9:
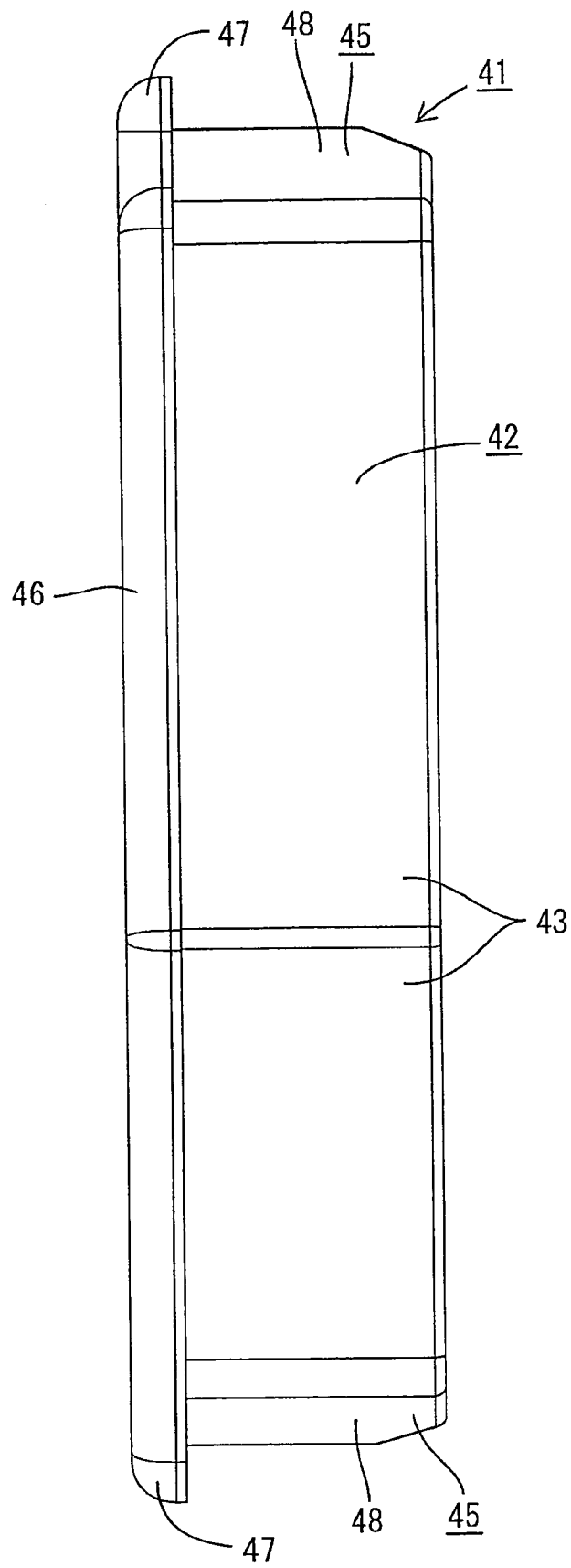
FIG. 9 is a plan view of the waterproof cover shown in FIG. 8.
Figure 10:
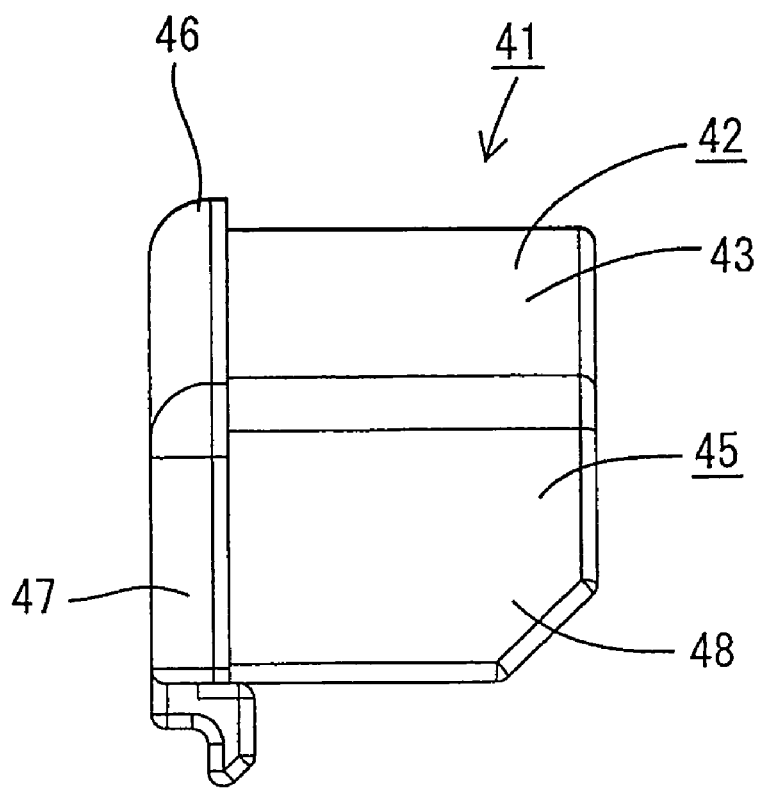
FIG. 10 is a side elevation view of the waterproof cover shown in FIG. 8.

As shown in FIGS. 3 and 10, the second waterproof front wall 44 is provided on an upper end with an upper water cut-off wall 46 that projects up to a position higher (to an upward direction in FIG. 10) than an upper surface of the first waterproof wall 42. The upper water cut-off wall 46 is formed through a lateral whole width of the second waterproof front wall 44 (FIG. 5). Also, as shown in FIG. 9, the second waterproof wall is provided on lateral opposite ends with a side water cut-off wall 47 extending laterally (in a lateral direction in FIG. 9) from the second waterproof side wall 45. The side water cut-off wall 47 is formed through the second waterproof front wall 44 in the vertical direction.

As shown in FIG. 6, each second waterproof side wall 45 is provided on an outer side surface with a second slope 48 that inclines down outward. The second slope 48 is formed through the second waterproof side wall 45 in the vertical direction.

As shown in FIG. 3, end edges of the first waterproof wall 42 and second waterproof side wall 45 at a side of the circuit assembly 12 (a left side in FIG. 3) are embedded in the seal member 39 described above.

Figure 11:
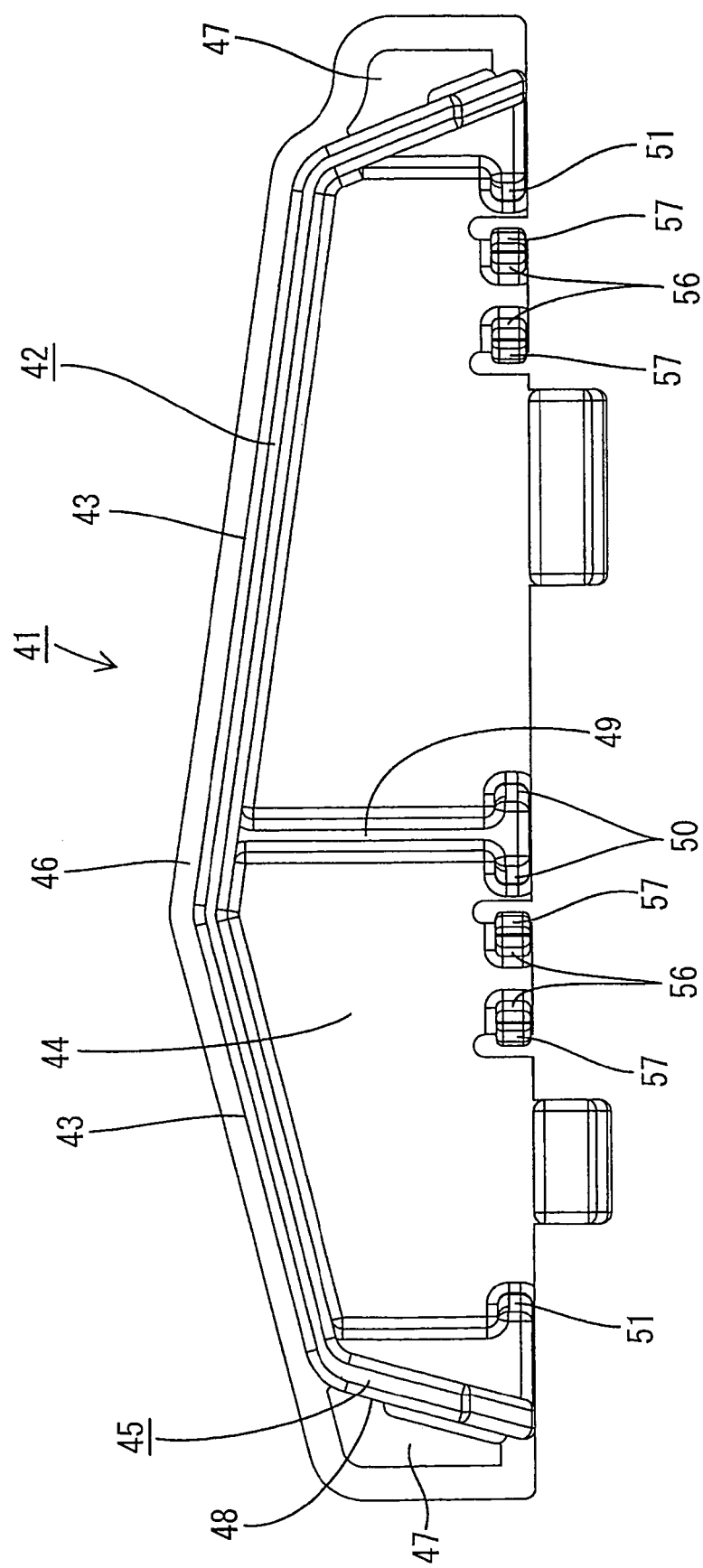
FIG. 11 is a rear elevation view of the waterproof cover shown in FIG. 8.

As shown in FIGS. 6 and 11, the first waterproof wall 42 is provided on a lower side surface with a rib 49 extending downward from a central part in a lateral direction. The rib 49 is provided on a lower end with a first guide rib 50 projecting laterally and extending in front and rear directions. Also, the pair of second waterproof side walls 45 are provided on lower ends with second guide ribs 51 projecting laterally and extending in front and rear directions.

Figure 7:
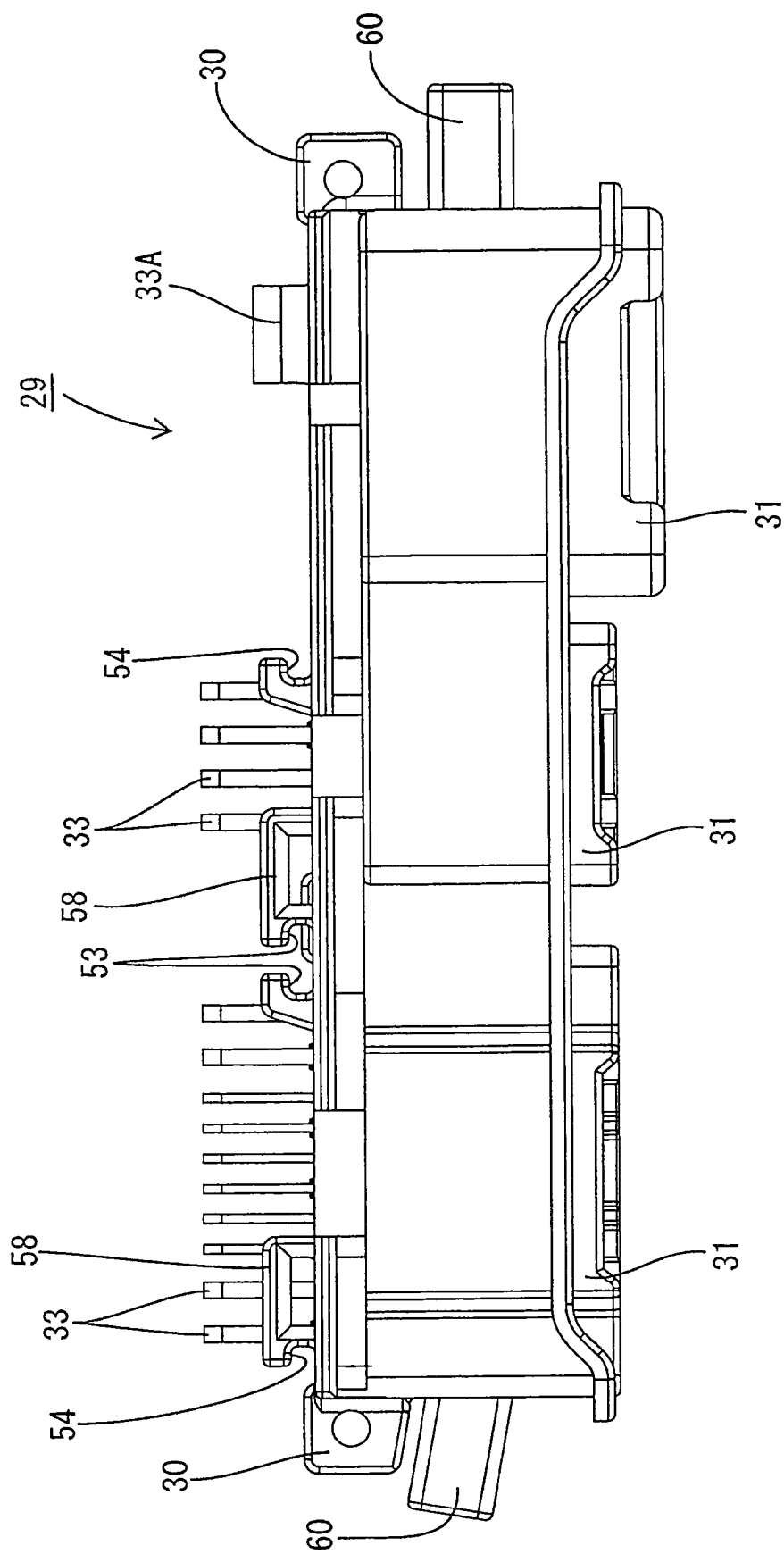
FIG. 7 is a front elevation view of a connector housing.

As shown in FIGS. 6 and 7, the inner wall 32 of the connector housing 29 is provided on the outer side surface with a first receiving groove 53 and a second receiving groove 54 for containing the first guide rib 50 and the second guide rib 51, respectively.

Figure 8:
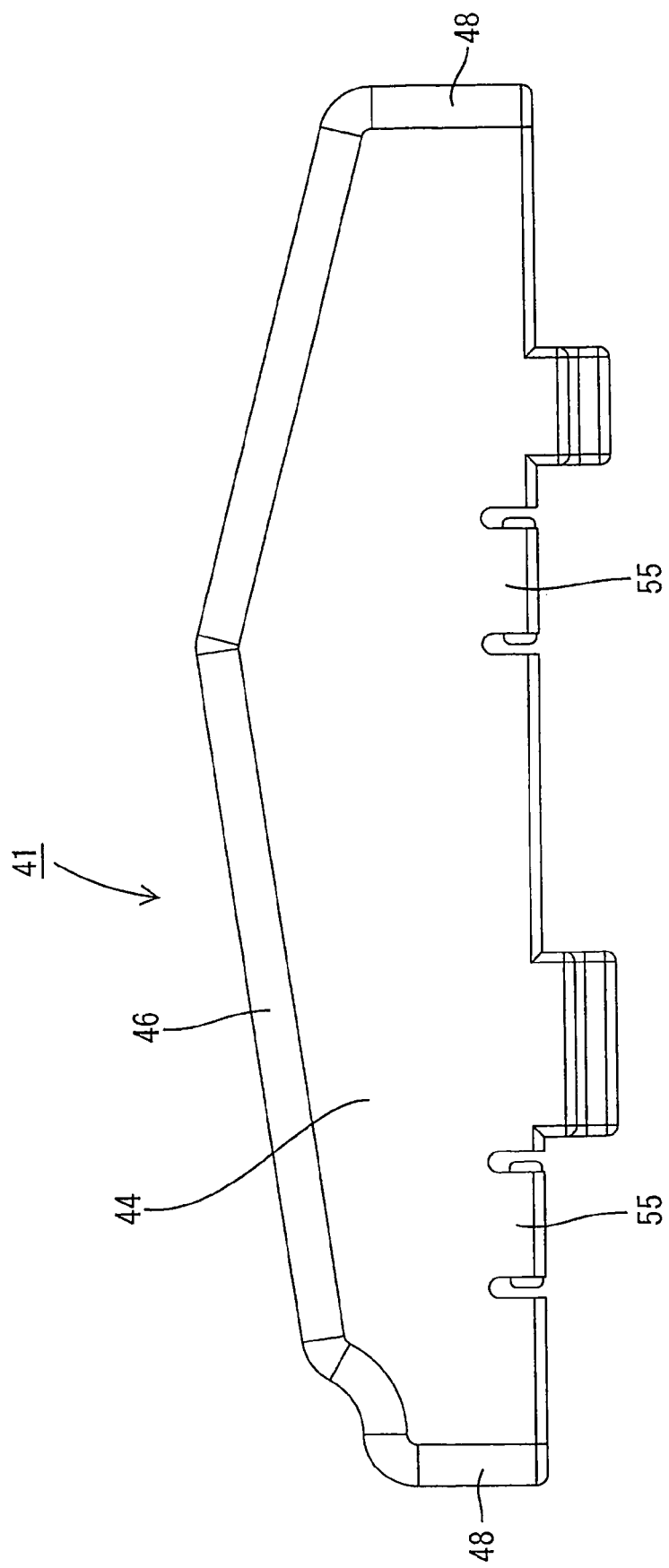
FIG. 8 is a front elevation view of a waterproof cover.
Figure 12:
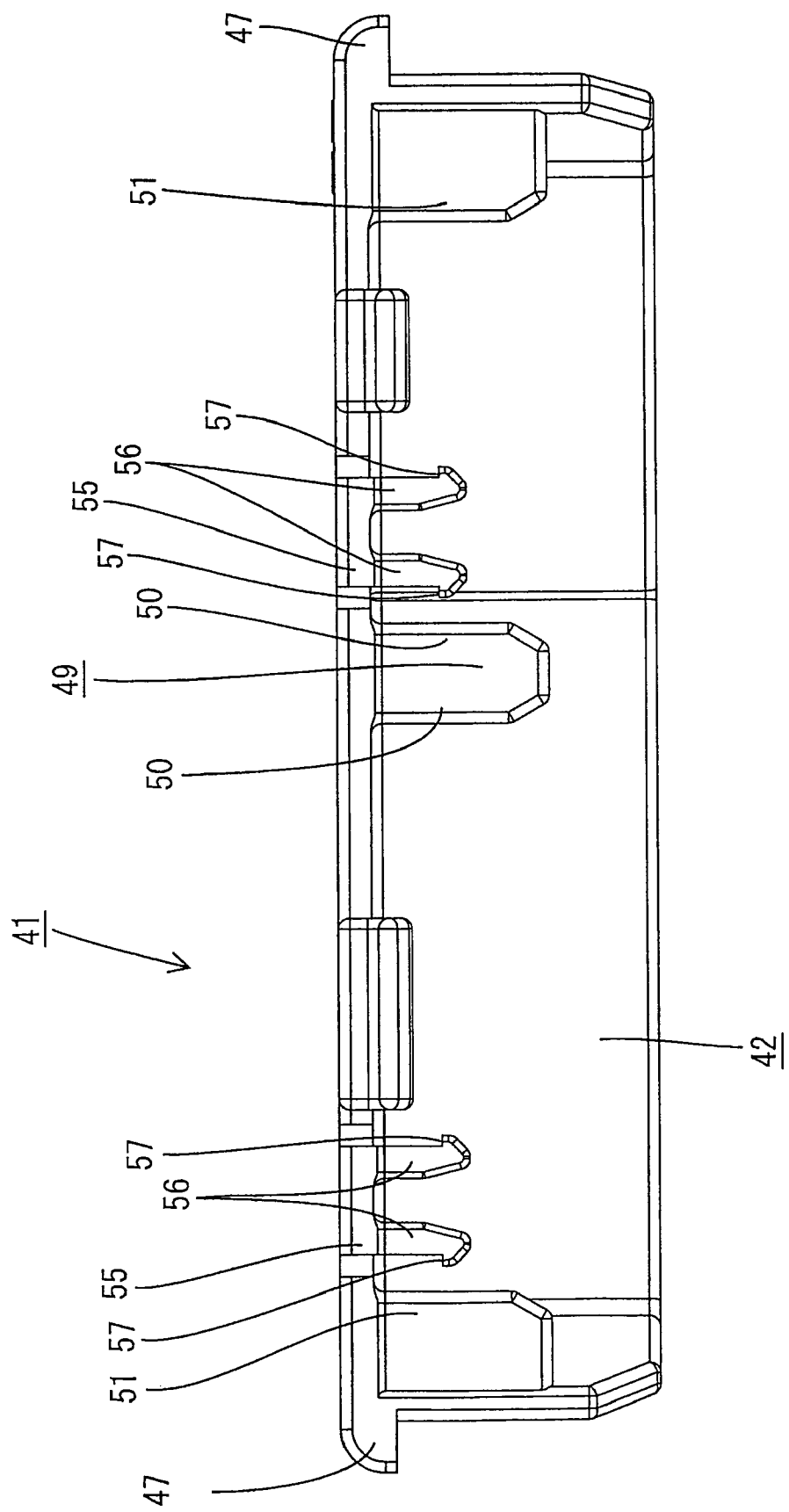
FIG. 12 is a bottom view of the waterproof cover shown in FIG. 8.

As shown in FIG. 8, the waterproof cover 41 is provided on a lower end edge with two engaging portions 55 projecting in an inner side (a lower side in FIG. 12). Each of the engaging portions 55 includes a pair of arms 56 and engaging pawls 57 projecting from lower ends of the arms 56 laterally (FIG. 12).

As shown in FIG. 12, projection sizes of the first and second guide ribs 50 and 51 from the second waterproof front wall 44 to its rear side (a lower side in FIG. 12) are set to be greater than projection sizes of the engaging portions 55 from the second waterproof front wall 44 to its rear side.

Figure 13:
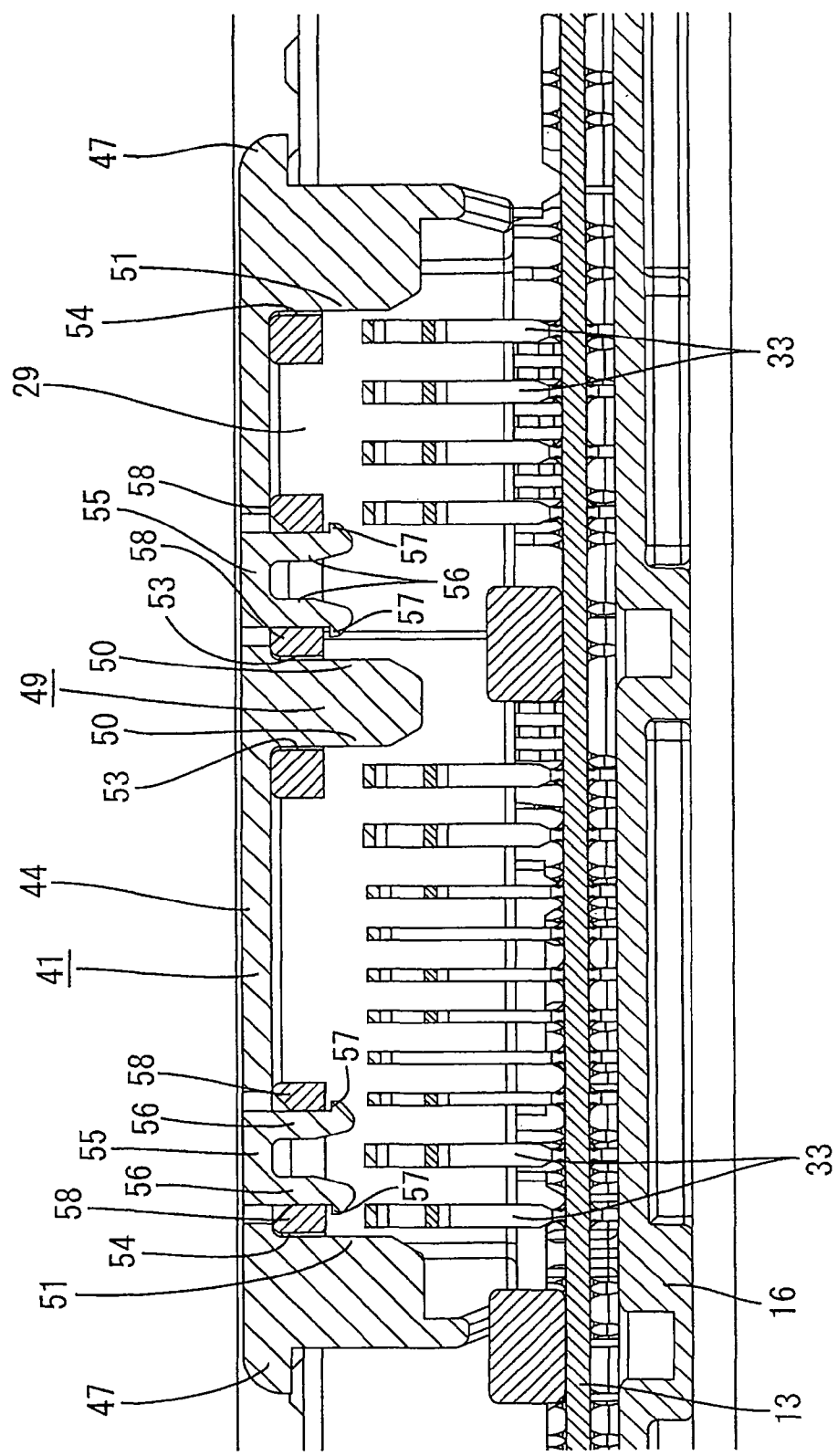
FIG. 13 is a section view of the electrical junction box taken along lines C-C in FIG. 4.

The engaging portions 55 are inserted through a front side into frame-like engaging and receiving portions 58 (FIG. 14) provided on an upper end edge of the connector housing 29. The arms 56 are deformed laterally and recover their original positions so that the engaging pawls 57 contact the engaging and receiving portions 58 from the rear side (FIG. 13). Thus, the waterproof cover 41 is attached to the connector housing 29. At this time, the first guide rib 50 is contained in the first receiving groove 53 from the front side while the second guide rib 51 is contained in the second receiving groove 54 from the front side. Thus, the waterproof cover 41 is guided to a regular position with respect to the connector housing 29.

(Drainage Structure)

Figure 14:
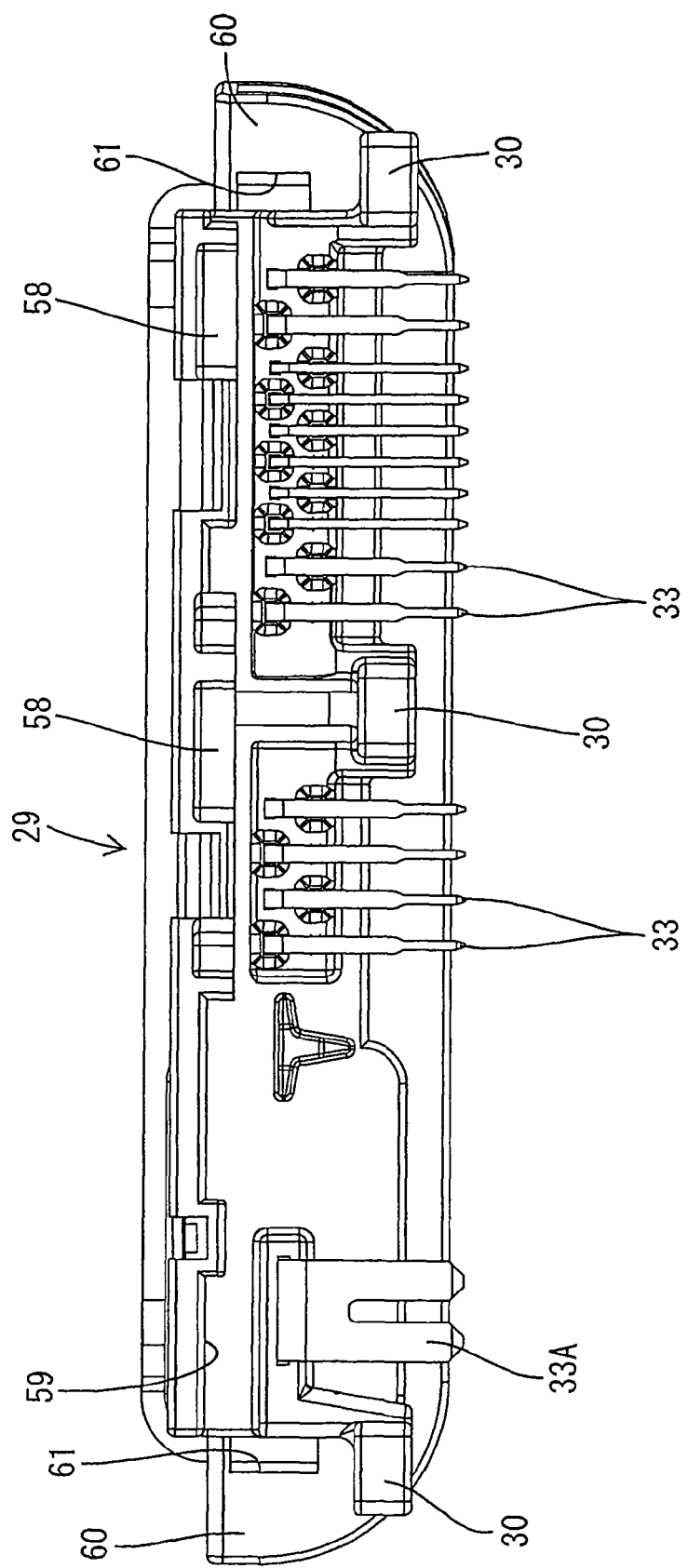
FIG. 14 is a plan view of the connector housing, illustrating the connector housing on which terminal metals are arranged.

As shown in FIG. 14, the connector housing 29 is provided on a relatively left end on the upper surface with a drainage groove 59 for guiding water flowing into the connector housing 29 to a side area (a left side edge in FIG. 14). As shown in FIG. 5, the drainage groove 59 is formed on the upper surface of the connector housing 29 except the area covered with the waterproof cover 41.

The connector housing 29 is provided on laterally opposite side edges with a pair of ear portions 60 projecting laterally. Each of the ear portions 60 is provided with the groove 38 (FIG. 5) for containing the packing 37. Each ear portion is provided with an escape hole 61 for draining the water that flows along the laterally opposite side edges of the connector housing 29.

Figure 15:
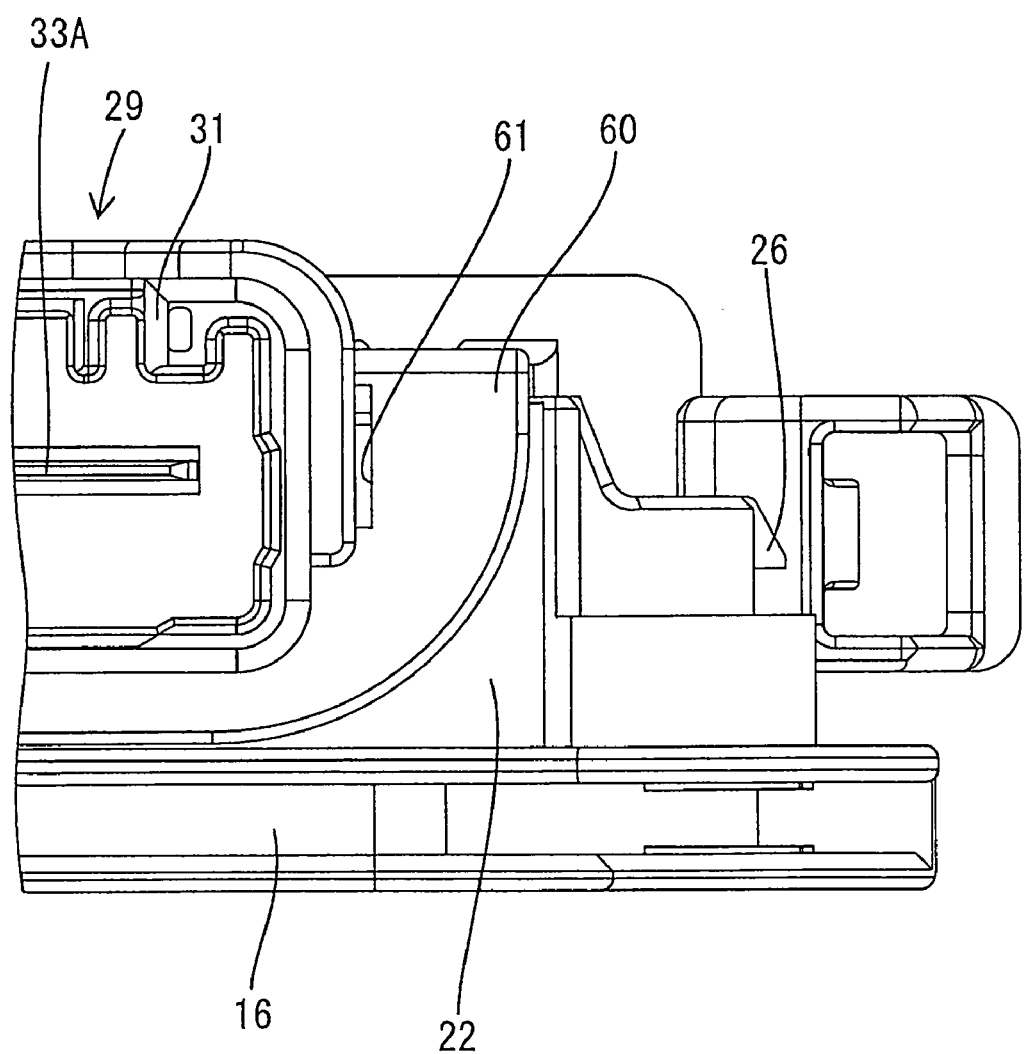
FIG. 15 is an enlarged bottom view of a main part of the electrical junction box, illustrating the box from which the cover is removed in FIG. 1.

As shown in FIG. 15, when the connector housing 29 is attached to the casing body 16, an opening of the escape hole 61 is directed downward (a front side in a direction passing the paper in FIG. 15).

When the cover 18 is attached to the casing body 16, as shown in FIG. 6, a lower end of the cover 18 is disposed below the escape hole 61 (in a lower side in FIG. 6). As shown in FIG. 16, when the cover 18 is attached to the casing body 16, a clearance is defined between the lower end of the cover 18 and the outer side surface of the connector housing 29. The clearance is open at the inner part (a front side in a direction passing the paper in FIG. 16. This clearance serves as a drainage port 62 for draining water out of the casing 11.

Next, an operation and effects of the present embodiment will be described below. First, a step of assembling the waterproof cover 41 to the connector housing 29 is explained. The waterproof cover 41 is attached to the connector housing 29 from its front side. Then, the first and second guide ribs 50 and 51 of the waterproof cover 41 are contained in the first and second receiving grooves 53 and 54, respectively. Thus, the waterproof cover 41 is positioned in the horizontal and vertical directions with respect to the connector housing 29.

When the first and second guide ribs 50 and 51 of the waterproof cover 41 are contained in the first and second receiving grooves 53 and 54, respectively, the waterproof cover 41 is displaced toward the rear side of the connector housing 29. Then, the engaging portions 55 of the waterproof cover 41 contact the engaging and receiving portions 58 of the connector housing 29 from its front side. When the waterproof cover 41 is further displaced toward the rear side of the connector housing 29, the arms 56 of the engaging portions 55 are deformed inwardly in a lateral direction. Thereafter, the arms recover their original positions and the engaging pawls 57 of the arms 56 contact the rear side of the engaging and receiving portions 58 of the connector housing 29. Thus, the waterproof cover 41 is assembled to the connector housing 29 at the regular position.

Next, a drainage path for water entering the casing 11 is explained. When water enters the casing 11 from, for example, the fuse-mounting section 17 due to rainfall or vehicle-washing, the water flows down in the casing 11 and reaches the upper surface of the first waterproof wall 42 of the waterproof cover 41. Then, the water flows on the first slopes 43 so that the water is guided on the laterally opposite sides of the waterproof cover 41.

The water that falls on the first waterproof wall 42 is restrained from flowing over the front side by means of the first water cut-off walls provided on the front side end edges of the first waterproof wall 42. Also, the water that falls on the second waterproof wall 45 is restrained from flowing over the front side by means of the second water cut-off walls provided on the laterally opposite side edges of the second waterproof front wall 44.

The water flowing down on the first slopes 43 on the first waterproof wall 42 flows down from the laterally opposite end edges of the first waterproof wall 42 onto the pair of second waterproof side walls 45. Since each second downward slope 48 is provided on the outer side surface of each second waterproof side wall 45, the water is guided outward in the right and left directions of the waterproof cover 41.

The water flows down from the lower end edge of each second downward slope 48. The water that flows down from the second waterproof side wall 45 of the waterproof cover 41 at the right side in FIG. 6 flows down through the escape hole 61, as shown by arrow A. Thereafter, the water is drained from the drainage port 62 shown in FIG. 16 to the outside of the casing 11.

On the other hand, the water that flows down from the second waterproof side wall 45 at the left side in FIG. 6 flows into the drainage groove 59 formed on the upper surface of the connector housing 29. The water that flows into the drainage groove 59 is guided to the side of the connector housing 29. The water that is guided to the side of the connector housing 29 flows down through the escape hole 61 in the connector housing 29, as shown by arrow B in FIG. 6. Thereafter, the water is drained from the drainage port 62 shown in FIG. 16 to the outside of the casing 11.

According to the present embodiment, the waterproof cover 41 is disposed in the casing 11. The waterproof cover 41 includes the first waterproof wall 42 that covers the upper parts of the adjacent terminal metals 33. Thus, it is possible to prevent the water entering the casing 11 from bridging across and adhering to the adjacent terminal metals 33. Consequently, it is possible to restrain the water from short-circuiting the adjacent terminal metals 33.

There is a possibility that the water entering the casing 11 adheres to the inner surface of the front wall of the cover 18 and flows down along the inner surface of the front wall 28 of the cover 18. There is also a fear that the water flowing along the inner surface of the front wall 28 of the cover 18 is dispersed toward the circuit assembly 12 due to, for example, vibrations of a motor vehicle.

In the present embodiment, the waterproof cover 41 includes the second waterproof front wall 44, for partitioning the space between the front wall 28 of the cover 18 and the adjacent terminal metals 33, disposed in the casing 11. This second waterproof front wall 44 can prevent the water from dispersing from the front wall 28 of the cover 18 and can prevent the adjacent terminal metals 33 from short-circuiting.

There is also a possibility that the water entering the casing 11 flows down along the inner surface of the side wall 19 of the casing body 16. Even if the water flowing down along the inner surface of the side wall 19 of the casing body 16 is dispersed toward the circuit assembly 12 by vibrations or the like, it is possible for the second waterproof side wall 45 to prevent the water from adhering to the terminal metals 33, since the second waterproof side wall 45 partitions the space between the side wall 19 of the casing body 16 and the adjacent terminal metals 33.

Thus, the present embodiment can improve the waterproof function of the electrical junction box 10.

Also, according to the present embodiment, the waterproof cover 41 is attached to the connector housing 29. Thus, it is possible to prevent the water from adhering to the terminal metals 33 drawn into the connector housing 29.

For example, in the case where the first waterproof wall 42, second waterproof front wall 44 and second waterproof side wall 45 are formed integrally with the casing body 16, the terminal metals 33 are covered with the first waterproof wall 42, second waterproof front wall 44, and second waterproof side wall 45. Consequently, when the circuit assembly 12, on which the connector housing 29 is mounted, is attached to the casing body 16, a working person must perform the assembling operation blindly, if necessary. This may lower efficiency in working.

In view of the above problem, according to the present embodiment, the waterproof cover 41 is formed individually from the casing 11. Thus, it is possible to cover the terminal metals 33 with the waterproof cover 41, since the waterproof cover 41 is attached to the connector housing 29 after the circuit assembly 12 is assembled to the casing body 16. Consequently, since blind assembling work is not required, workability can be improved.

According to the present embodiment, the first waterproof wall 42 is provided on the upper surface with each first downward slope 43 that inclines down in the lateral direction. Thus, since the water adhering to the upper surface of the first waterproof wall 42 flows down while it is being guided by the first downward slope 43, it is possible to improve a drainage function in the casing 11.

Furthermore, in the present embodiment, the connector housing 29 is provided on the upper surface with the drainage groove 59 for guiding the water that falls on the connector housing 29 toward the side of the connector housing 29. Thus, the water adhering to the upper surface of the connector housing 29 is guided to the drainage groove 59 and is drained onto the side of the connector housing 29. Thus, it is possible to further improve the drainage function in the casing 11.

In addition, since the casing 11 is provided with the drainage port 62 in the bottom between the lower end of the cover 18 and the outer side surface of the connector housing 29, the water flowing down onto the bottom of the casing 11 is drained through the drainage port 62 outside the casing 11. Thus, it is possible to further improve the drainage function in the casing 11.

Also, the surface of the circuit assembly 12 is covered with the seal member 39, and the end edge of the first waterproof wall 42 at the side of the circuit assembly 12 is embedded in the seal member 39. Thus, it is possible to prevent the water that falls onto the upper surface of the first waterproof wall 42 from overflowing from the clearance between the end edge at the side of the circuit assembly 12 and the seal member 39, and from adhering to the terminal metals 33 below the first waterproof wall 42. Consequently, it is possible to prevent the adjacent terminal metals 33 from short-circuiting.

Furthermore, the end edge of the second waterproof side wall 45 at the side of the circuit assembly 12 is embedded in the seal member 39. Thus, it is possible to prevent the water from entering through the space between the second waterproof side wall 45 and the seal member 39.

Other Embodiments

It should be noted that the present invention is not limited to the embodiment described above and illustrated in the drawings. For example, the following embodiments will fall in the technical scope of the present invention.

(1) Although the waterproof cover 41 is attached to the connector housing 29 in the present embodiment, the present invention is not limited to this embodiment. The waterproof cover 41 may be attached to any member such as the cover 18, casing body 16, circuit assembly 12 or the like so long as the member is disposed in the casing 11.

(2) Although the end edge of the first waterproof wall 42 at the side of the circuit assembly 12 is embedded in the seal member 39 in the present embodiment, the present invention is not limited to this embodiment. The end edge of the first waterproof wall 42 at the side of the circuit assembly 12 may contact the surface of the seal member 39 and may not be embedded in the seal member 39.

(3) Although the end edge of the second waterproof side wall 45 at the side of the circuit assembly 12 is embedded in seal member 39 in the present embodiment, the present invention is not limited to this embodiment. The end edge of the second waterproof side wall 45 at the side of the circuit assembly 12 may contact the surface of the seal member 39 and may not be embedded in the seal member 39.

(4) Although the first waterproof wall 42 is provided on the outer side surfaces of the upper wall 21 with the first downward slopes 45 in the present embodiment, the present invention is not limited to this embodiment. The outer side surfaces of the upper wall 21 of the first waterproof wall 42 may be flat.

(5) Although the first downward slopes 43 incline down toward the laterally opposite ends from the top near the central part of the lateral width size of the waterproof cover 41 in the present embodiment, the present invention is not limited to this embodiment. The first downward slopes 43 may incline down from the top at an end to the other end of the waterproof cover 41.

(6) Although the connector housing 29 is formed individually from the casing 11 in the present embodiment, the present invention is not limited to this embodiment. The connector housing 29 may be formed integrally with the casing 11 such as the cover 18, casing body 16 or the like.

What is claimed is:

1. An electrical junction box comprising:
a casing having a bottom, the casing containing a circuit assembly;
a connector housing disposed on the bottom of the casing and adapted to be coupled to a mating connector, wherein the connector housing has an upper surface;
a plurality of terminal metals connected to the circuit assembly and passing through a wall of the connector housing to be drawn into the connector housing; and
a cover; and
a waterproof cover formed independent of the casing and disposed in the casing and attached to the connector housing, the waterproof cover including
a first waterproof wall that covers a space above adjacent terminal metals, the first waterproof wall having an upper surface, and
a second waterproof side wall that partitions a space between the adjacent terminal metals and a side wall of the casing, the second waterproof side wall having an upper surface, wherein
the first waterproof wall and the second waterproof side wall are connected at an end of each of the first waterproof wall and the second waterproof side wall,
the upper surface of the first waterproof wall is provided with a first slope that is inclined downward at a first angle, and
the upper surface of the second waterproof side wall is provided with a second slope that is inclined downward at a second angle, and the second angle is greater than the first angle, and
the cover covering the connector housing and the waterproof cover.

2. The electrical junction box of claim 1, wherein the upper surface of the connector housing is provided with a drainage groove for guiding water falling onto the connector housing toward a side of the connector housing.

3. The electrical junction box of claim 1, wherein a drainage port is provided in the bottom of the casing.

4. The electrical junction box of claim 1, wherein a surface of the circuit assembly is covered with a seal member, and an end edge of the first waterproof wall at a side of the circuit assembly is embedded in the seal member.

5. The electrical junction box of claim 1, wherein a surface of the circuit assembly is covered with a seal member, and an end edge of the second waterproof side wall at a side of the circuit assembly is embedded in the seal member.

6. The electrical junction box of claim 1, wherein a surface of the circuit assembly is covered with a seal member, and end edges of the first waterproof wall and second waterproof side wall at a side of the circuit assembly are embedded in the seal member.

7. The electrical junction box of claim 1, wherein the first waterproof wall is provided on an upper surface of the electrical junction box with downward slopes.

8. The electrical junction box of claim 1, wherein the connector housing is provided on an upper surface of the electrical junction box with a drainage groove for guiding water falling onto the connector housing toward a side of the connector housing.

9. The electrical junction box of claim 1, wherein the connector housing is provided on an upper surface of the electrical junction box with a drainage groove for guiding water falling onto the connector housing toward a side of the connector housing.

10. The electrical junction box of claim 1, wherein a drainage port is provided in the bottom of the casing.

11. The electrical junction box of claim 1, wherein a drainage port is provided in the bottom of the casing.

12. The electrical junction box of claim 2, wherein a drainage port is provided in the bottom of the casing.

13. The electrical junction box of claim 1, wherein a surface of the circuit assembly is covered with a seal member, and an end edge of the first waterproof wall at a side of the circuit assembly is embedded in the seal member.

14. The electrical junction box of claim 1, wherein a surface of the circuit assembly is covered with a seal member, and an end edge of the first waterproof wall at a side of the circuit assembly is embedded in the seal member.

15. The electrical junction box of claim 2, wherein a surface of the circuit assembly is covered with a seal member, and an end edge of the first waterproof wall at a side of the circuit assembly is embedded in the seal member.

16. The electrical junction box of claim 3, wherein a surface of the circuit assembly is covered with a seal member, and an end edge of the first waterproof wall at a side of the circuit assembly is embedded in the seal member.

17. The electrical junction box of claim 1, wherein a surface of the circuit assembly is covered with a seal member, and an end edge of the second waterproof side wall at a side of the circuit assembly is embedded in the seal member.

18. The electrical junction box of claim 1, wherein a surface of the circuit assembly is covered with a seal member, and an end edge of the second waterproof side wall at a side of the circuit assembly is embedded in the seal member.

19. An electrical junction box comprising:
a casing having a bottom surface and including a circuit assembly;
a connector housing disposed on the bottom surface of the casing that couples to a mating connector, the connector housing having an upper surface;
a plurality of terminal metals connected to the circuit assembly and extending through a wall of the connector housing into the connector housing;
a cover; and
a waterproof cover formed independent of the casing and disposed in the casing and attached to the connector housing, the waterproof cover including
a top waterproof wall that covers a space above the terminal metals, the top waterproof wall having at least two upper surfaces that are inclined to form at least two downward slopes,
at least a pair of side waterproof walls that partition a space between the terminal metals and a side wall of the casing, the side waterproof walls having an upper surface having a downward slope, and
a front waterproof wall that partitions a space between the cover and the terminal metals, wherein
each of the pair of side waterproof walls is connected to an opposite end of the top waterproof wall, and
the downward slope of the side waterproof walls being greater than the downward slopes of the top waterproof wall, and
the cover covering the connector housing and the waterproof cover.

* * * * *